(12) United States Patent
Wichtendahl et al.

(10) Patent No.: US 9,735,363 B2
(45) Date of Patent: Aug. 15, 2017

(54) METHOD FOR IMPRINTING OPTO-ELECTRONIC COMPONENTS WITH BUS BARS

(71) Applicant: HELIATEK GMBH, Dresden (DE)

(72) Inventors: Ralph Wichtendahl, Dresden (DE); Andreas Borkert, Radeberg (DE)

(73) Assignee: HELIATEK GMBH, Dresden (DE)

(*) Notice: Subject to any disclaimer, the term of this patent is extended or adjusted under 35 U.S.C. 154(b) by 0 days.

(21) Appl. No.: 14/435,857

(22) PCT Filed: Oct. 10, 2013

(86) PCT No.: PCT/IB2013/059257
§ 371 (c)(1),
(2) Date: Apr. 15, 2015

(87) PCT Pub. No.: WO2014/060912
PCT Pub. Date: Apr. 24, 2014

(65) Prior Publication Data
US 2015/0270487 A1    Sep. 24, 2015

(30) Foreign Application Priority Data

Oct. 15, 2012    (DE) .................... 10 2012 109 777

(51) Int. Cl.
*H01L 51/56*    (2006.01)
*H01L 51/00*    (2006.01)
(Continued)

(52) U.S. Cl.
CPC ........ *H01L 51/0022* (2013.01); *H01L 51/445* (2013.01); *H01L 51/5212* (2013.01);
(Continued)

(58) Field of Classification Search
CPC ......... H01L 51/00; H01L 51/44; H01L 51/56; H01L 51/445; H01L 51/5212;
(Continued)

(56) References Cited

U.S. PATENT DOCUMENTS

| 7,795,067 | B1 | 9/2010 | Basol |
| 7,825,326 | B2 | 11/2010 | Koppe |

(Continued)

FOREIGN PATENT DOCUMENTS

| CN | 101707227 A | 5/2010 |
| CN | 102144314 A | 8/2011 |

(Continued)

OTHER PUBLICATIONS

Hubner, Ing. G. et al., "New screen printing technology increases the efficiency of solar cells", Jun. 2005, 3 pages.

(Continued)

*Primary Examiner* — Selim Ahmed
(74) *Attorney, Agent, or Firm* — Heslin Rothenberg Farley & Mesiti P.C.

(57) ABSTRACT

In a method for imprinting optoelectronic components with at least one bus bar, the bus bar following the shape of the optoelectronic component and allowing a homogeneous color impression on the rear face of the component, the bus bar is printed on a basic material before deposition of a photoactive layer. The basic material may comprise a substrate, or an electrically conductive transparent layer on a substrate. Subsequently, a conductive layer on the substrate is structured to form isolated regions, the photoactive layer is deposited and structured, and then a counter electrode is applied and structured.

7 Claims, 2 Drawing Sheets

Figure 1:
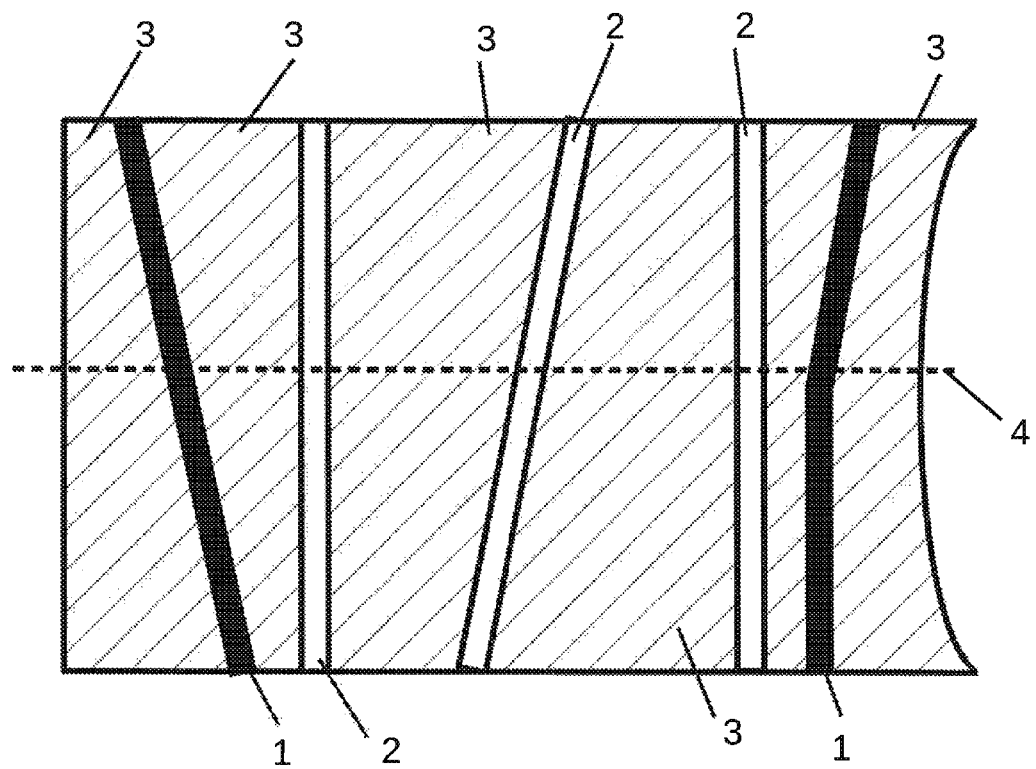

(51) Int. Cl.
*H01L 51/44* (2006.01)
*H01L 51/52* (2006.01)
*H01L 27/32* (2006.01)

(52) U.S. Cl.
CPC .......... *H01L 51/5228* (2013.01); *H01L 51/56* (2013.01); *H01L 27/3204* (2013.01); *H01L 27/3237* (2013.01); *Y02E 10/549* (2013.01); *Y02P 70/521* (2015.11)

(58) Field of Classification Search
CPC . H01L 51/5228; H01L 31/18; H01L 31/0224; H05B 33/06; H05B 33/14; H05B 33/26
USPC ...................................... 438/22, 82
See application file for complete search history.

(56) References Cited

U.S. PATENT DOCUMENTS

| | | | |
|---|---|---|---|
| 2007/0062577 A1 | 3/2007 | Koppe | |
| 2007/0273276 A1* | 11/2007 | Ottermann | H01L 51/0005 313/505 |
| 2011/0266588 A1* | 11/2011 | Gaerditz | H01L 51/445 257/99 |
| 2012/0097939 A1 | 4/2012 | Fujita | |
| 2012/0180843 A1 | 7/2012 | Park | |

FOREIGN PATENT DOCUMENTS

| | | |
|---|---|---|
| DE | 10324880 A1 | 1/2005 |
| DE | 102008045948 A1 | 3/2010 |
| DE | 102010054327 A1 | 6/2012 |
| EP | 0012497 A2 | 9/1979 |
| EP | 0012497 A2 | 6/1980 |
| EP | 2395571 A1 | 6/2010 |
| EP | 2385556 A1 | 11/2011 |
| EP | 2395571 A1 | 12/2011 |
| GB | 2487342 A | 5/2010 |
| GB | 2487342 A | 7/2012 |
| JP | 2003123990 A | 4/2003 |
| WO | 2013058540 A1 | 4/2013 |

OTHER PUBLICATIONS

International Search Report for PCT/IB2013/059257 dated Mar. 21, 2014.

* cited by examiner

METHOD FOR IMPRINTING OPTO-ELECTRONIC COMPONENTS WITH BUS BARS

CROSS REFERENCE TO RELATED APPLICATIONS

This application is the U.S. National Filing of PCT Application No. PCT/IB2013/059257 filed on Oct. 10, 2013 and published in German as WO 2014/060912 A1 on Apr. 24, 2014, which claims priority of German patent application number 10 2012 109 777.1 filed on Oct. 15, 2012, the entire disclosure of these applications being hereby incorporated herein by reference.

BACKGROUND ART

The invention relates to a method for imprinting opto-electronic components with at least one busbar, wherein the busbar follows the shaping of the optoelectronic component and enables a homogeneous color impression on the rear side of the component.

Optoelectronics is composed of the fields of optics and semiconductor electronics. It encompasses systems and methods which enable the conversion of electronically generated data and energies into light emission or convert light emissions into energy. Optoelectronic elements, in particular organic photovoltaic modules (PV module) and organic light emitting diodes (OLED), referred to hereinafter as OPV modules, generate electrical energy or convert electrical energy into light emissions, which has to be routed out of the module or routed in for application in the further course of the procedure. This necessitates so-called busbars, which have to meet the requirements of a flexible OPV module. Busbars constitute the point in an optoelectronic component at which the converted energy is concentrated and forwarded in the form of electric currents. Busbars are widely used in the semiconductor industry. As prior art, in the field of photovoltaics, busbars are known which are applied on the front side or on the rear side of the photovoltaic module in a rectangular or square shape. The dimensions of the cross section of a busbar depend on the current intensity to be transmitted. Busbars are applied by means of screen printing methods, inter alia. In this regard, DE102010054327A1 describes a method for producing a paste-application-selective screen printing solar cell metallization in which the layer thickness of the busbar is variable and the application volume of the silver paste is minimized, as a result of which production costs are lowered.

The shadow casting of busbars proves to be disadvantageous, this arising during paste printing on the front side of a photovoltaic module. Busbars printed from pastes had a defined height and width which cast a shadow on the photovoltaic module upon insolation and thus disadvantageously reduced the efficiency of the module.

A different procedure is evident from EP12497A1. Here the busbars are applied to the photovoltaic module in the form of metal strips. The shadow casting is thus minimized, but the solution proves to be unsatisfactory for transparent PV modules. The lower region of the busbar is not coated with absorber material, as a result of which a homogeneous color impression does not arise since the busbar remains visible from the rear side of the PV module. Furthermore, said metal strips can be applied in non-rectilinear geometries only with a disproportionate outlay.

Other solution approaches pursue the application of a busbar on the rear side of a PV module. CN000101707227B describes this process for a solar film, thereby counteracting the arising of air bubbles. The application of busbars on the rear side of a PV module additionally increases the efficiency since the entire front side of the PV module is available for energy production. This method also proves to be unsatisfactory for producing flexible transparent PV modules. As in the previously demonstrated solutions, the problem of the homogeneous color impression and the freedom of shape of the busbar routing remains.

Moreover, flexible PV modules have to meet stringent requirements. In this case, the cross connections of the busbars should be producible over the module width in order to route the negative and positive pole to a connection point. Moreover, the busbars must have the flexibility of the PV module. U.S. Pat. No. 7,795,067 B1 describes a flexible PV module having a flexible busbar, wherein a semitransparent solar cell is involved in that case and the busbar is visible.

BRIEF SUMMARY OF THE INVENTION

The object of the present invention is to specify a method for applying busbars which overcomes the disadvantages mentioned above. For this purpose, a method should be provided in order that busbars are producible over the entire width of the PV module, adapt to arbitrary, including curvilinearly bounded shapes of the PV module and ensure a homogeneous color impression of the PV module.

The invention presents a method for applying a busbar to an optoelectronic component, wherein at least one busbar is already applied by means of printing methods before the deposition of the photoactive layer, thus giving rise to a homogeneous color impression on the rear side of the module. That firstly requires the provision of a basic material consisting of a substrate and a conductive layer. A transparent film, glass or other materials that transmit the desired light spectra (transparency, semitransparency, opaque) are conceivable as the substrate. TCOs (transparent conductive oxides), encompassing ITO, $ZnO:AlSnO_2:F$ and more recent developments such as DMD, nano-wire, Ag or graphene, are conceivable as the conductive layer. Firstly, the busbars are applied by means of printing methods. A further step involves structuring the conductive layer to form individual regions insulated from one another, wherein the structuring comprises laser cutting, scribing or lithographic processes.

The subsequent step involves depositing at least one active layer, e.g. an absorber layer, onto the structured conductive layer consisting of at least one busbar. This process advantageously takes place by means of vapor deposition in vacuo.

After the deposition of the active layer, the latter is to be structured by means of methods already mentioned. The last step involves applying and structuring a counterelectrode comprising Al (aluminum) or Ag (silver), for example.

In a further embodiment of the invention, the busbar is applied before the deposition of a conductive transparent layer directly onto the basic material. In this case, the layout of the conductive layer depends on the printing of the busbar.

In a further embodiment of the invention, the printing process for applying at least one busbar comprises screen printing, inkjet printing and/or some other method based on printing. According to a scientific publication about screen printing technology (Hübner, Erath, Mette, Horizonte 29, Neue Siebdrucktechnologie erhöht den Wirkungsgrad von Solarzellen [New screen printing technology increases the efficiency of solar cells], Reutlingen 2006, page 6), conventional screen printing technology is carried out by means of solvent-based printing pastes of high viscosity. The printer is orientated according to the structures of the substrate. In the first printing method, the orientation preferably takes place at the corners of the substrate. Further printing methods are preferably to be orientated toward the structures already printed.

The inkjet method follows the method of a commercially available printer, which, however, applies the conductive medium in the liquid state as ink to the solar cell. With regard to the printing method for busbars, the ink comprises liquid Al, Ag or some other substrate which serves as transfer medium and is applied to the PV module in the form of a busbar.

Moreover, other methods, such as stamp printing, embossing printing, distortion printing, pigmentography or electronic printing methods, are conceivable.

In one embodiment of the invention, the busbar is applied after the structuring of the conductive layer on the substrate.

In a further embodiment of the invention, the busbar can be realized as a free shape, comprising rectilinear, rectangular, curved. Moreover, simultaneous or isolated application of at least one busbar as longitudinal and cross connector is possible. What is advantageous about the formation of free shapes is the high variability and adaptability of the PV module to its surroundings. By way of example, integration in automobile panes necessitates PV modules which adapt to the automobile pane. Therefore, they have a curved and non-straight shape. It is only the high shape variability of printed busbars that enables the use of PV modules in and/or on differently shaped objects.

In one specific embodiment of the invention, the busbar is arranged non-rectilinearly and/or non-parallel to one another.

In a further embodiment of the invention, at least one busbar in the embodiment, comprising cross connections, is producible over the module width and routes the two poles, comprising the negative and positive pole, of the module to a connection point. PV modules, particularly flexible PV modules, in particular flexible organic PV modules, are variable in terms of their dimensions, as a result of which small, and also large modules up to a number of meters in length and width are producible. The advantage afforded by the present printing methods is that it is variable to the effect that it adapts to the dimensions and shape of the PV module. A further advantage is that a separate separating process, such as takes place in the case of busbars in metal strip form, is not carried out, thus resulting in a cost saving in manufacture.

In a further embodiment of the invention, the optoelectronic component is a flexible organic PV module or an organic light emitting diode.

A flexible organic PV module is configured with active layers. In this case, the active layers can be constructed from polymers (e.g. U.S. Pat. No. 7,825,326 B2) or small molecules (e.g. EP 2385556 A1). While polymers are distinguished by the fact that they cannot be evaporated and can therefore be applied only from solutions, small molecules can usually be evaporated and can be applied either as solution, like polymers, but also by means of a variety of evaporation techniques. The advantage over conventional components on an inorganic basis (semiconductors such as silicon, gallium arsenide) is the in part extremely high optical absorption coefficient (up to $2 \times 10^5$ cm$^{-1}$). Also advantageous is the possibility of producing flexible large-area components on plastic films, which offer virtually unlimited possibilities for variation. A further technical aspect is the production of transparent components which can be integrated in glass elements, wherein the homogeneous color impression on account of the integrated busbar has a particularly advantageous effect compared with conventional solar modules.

Organic light emitting diodes (organic light emitting device, OLED) consist of at least one organic semiconductor layer which is embedded between two electrodes and emits light when there is a current flow (electroluminescence). The active layers are constructed from polymers (GB2487342A) or small molecules (EP2395571A1), as in the case of an organic PV module. The very flat configuration, the high flexibility, the possibility of production on plastic films and the low energy demand enable the OLEDs to be used in a wide variety of areas of application (e.g. displays for cellular phones, televisions, radios, etc.). On account of the above-mentioned properties and areas of application, the printed busbars have an advantageous effect in production and the areas of use, since a homogeneous color impression and integration in freeform objects comprising curvatures, roundings or objects having cutouts are possible.

BRIEF DESCRIPTION OF THE DRAWING FIGURES

Figure 2:
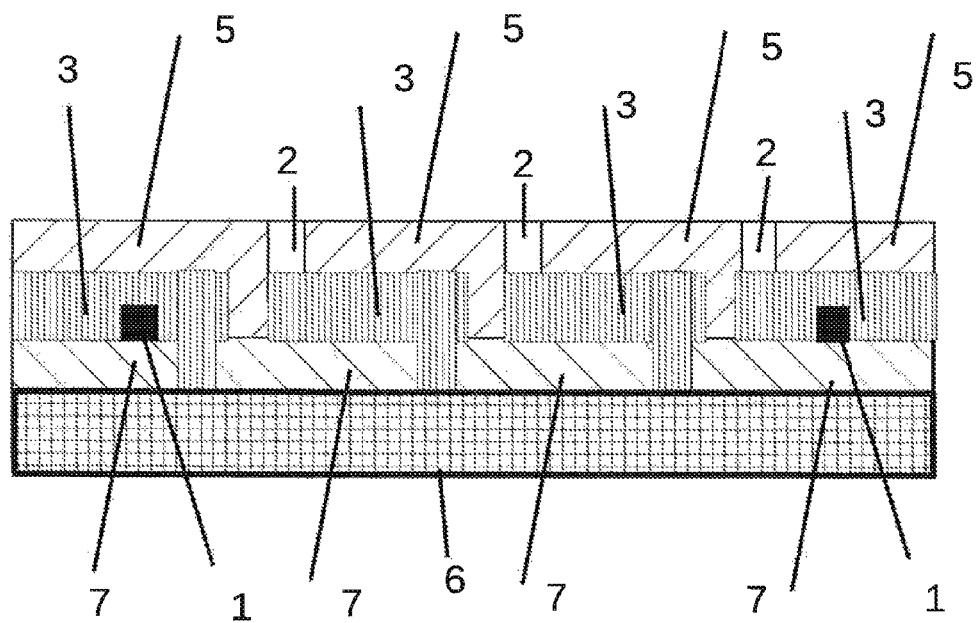

The invention will be explained thoroughly below on the basis of some exemplary embodiments and figures. In this case, the exemplary embodiments are intended to describe the invention, without restricting the latter. In the figures:

FIG. 1 shows a schematic construction of an organic solar cell in plan view, a busbar running on each of the sides of said solar cell, and FIG. 2 shows a schematic construction of an organic solar cell in cross section.

DETAILED DESCRIPTION

In one exemplary embodiment, reference is made to the homogeneous color impression and the configuration in free shapes. FIG. 1 illustrates the shapeless configuration of the busbars. Depending on the area of application, they can follow the shape of the PV module. An oblique and angled busbar 1 is visible in the present case. These busbars follow the layout of the conductive layer 3, which was structured by means of laser cutting, scribing or lithographic processes.

FIG. 2 illustrates the construction of an organic PV module in cross section 4, wherein a homogeneous color impression is produced on the rear side of the module. A substrate film 6 serves as basic material. The front electrode 7 can be structured before or after the application of the busbars. The busbars 1 are applied to the front electrode 7 by means of printing methods.

The further process is distinguished by the vapor deposition of the active layer 3, for example a general absorber layer, in vacuo. This is followed by the application of a counterelectrode 5, which is in turn structured 2 and orientated to the structuring of the front electrode 7.

The invention claimed is:

1. A method for imprinting of a module of an optoelectronic component with at least one bus bar, wherein the at least one bus bar follows shaping of the module and enables a homogeneous color impression on a rear side of the component, comprising the following steps:
   a) providing a basic material, comprising at least one substrate;
   b) printing at least one bus bar directly afterward onto the basic material, the at least one bus bar constituting a point in the optoelectronic component at which converted energy is concentrated and forwarded in a form of an electric current;
c) structuring a conductive layer on the at least one substrate to form individual regions insulated from one another;
d) depositing at least one active layer by vapor deposition onto the structured conductive layer including onto the at least one bus bar;
e) structuring the at least one active layer; and
f) applying and structuring a counterelectrode.

2. The method as claimed in claim 1, wherein the basic material further comprises the conductive layer, the conductive layer comprises an electrically conductive transparent layer, and the at least one bus bar is printed onto the electrically conductive transparent layer on the at least one substrate.

3. The method as claimed in claim 1, wherein the step of printing at least one bus bar comprises screen printing, inkjet printing and/or some other form of printing.

4. The method as claimed in claim 1, wherein the at least one bus bar is realized as a free shape, comprising rectilinear, rectangular, and/or curved, and/or enables simultaneous application of the at least one bus bar as longitudinal and cross connector.

5. The method as claimed in claim 1, wherein the at least one bus bar is producible over a width of the module and routes a negative pole and a positive pole of the module to a connection point.

6. The method as claimed in claim 1, wherein the module of an optoelectronic component comprises a flexible organic photovoltaic module or an organic light emitting diode.

7. The method as claimed in claim 1, wherein the at least one bus bar is printed on the at least one substrate of the basic material before the conductive layer is applied to the at least one substrate.

* * * * *